United States Patent
Tong et al.

[11] Patent Number: 5,847,991
[45] Date of Patent: Dec. 8, 1998

[54] SYSTEM FOR RECORDING VOICE AS ANALOG VALUES PROGRAMMED INTO SINGLE BIT CELLS EEPROMS OR FLASH EEPROM

[76] Inventors: Hing S. Tong, 19335 Dehavilland Dr., Saratoga, Calif. 95070; Philip K. Siu, 11629 Dawson Dr., Los Altos, Calif. 94022

[21] Appl. No.: 859,052

[22] Filed: May 20, 1997

[51] Int. Cl.$^6$ .................................................. G11C 16/04
[52] U.S. Cl. ...................................... 365/185.03; 365/45
[58] Field of Search ............................. 365/45, 185.03, 365/185.28, 185.24

[56] References Cited

U.S. PATENT DOCUMENTS

| | | | |
|---|---|---|---|
| 4,318,188 | 3/1982 | Hoffmann | 365/45 |
| 4,809,224 | 2/1989 | Suzuki et al. | 365/94 |
| 4,989,179 | 1/1991 | Simko | 365/45 |
| 5,119,092 | 6/1992 | Sumi et al. | 341/60 |
| 5,163,021 | 11/1992 | Mehrotra et al. | 365/185 |
| 5,241,494 | 8/1993 | Blyth et al. | 365/45 |
| 5,262,984 | 11/1993 | Noguchi et al. | 365/185 |
| 5,293,560 | 3/1994 | Harari | 365/185 |

OTHER PUBLICATIONS

Christoph Bleiker, et al., A Four–State EEPROM Using Floating–Gate Memory Cells, *IEEE J. Solid–State Circuits*, vol. SC–22, No. 3, Jun. 1987, pp. 357–360.

*Primary Examiner*—David Nelms
*Assistant Examiner*—Thong Le
*Attorney, Agent, or Firm*—Law Offices of Thomas E. Schatzel, A Prof. Corp.

[57] ABSTRACT

An incoming audio analog signal is sampled at a Nyquist criterion rate. The particular analog value sampled at each period causes one of a suite of programming algorithms to be selected and applied to a particular EEPROM memory cell. For example, there can be 256 different programming algorithms in the suite that open-loop result in a zero to full range analog multi-state data being recorded in each memory cell. The programming algorithms can vary the programming pulse heights, pulse widths and number of pulses applied to the selected memory cell. For a corrected readback, each or a representative spread of programming algorithms are "test-fired" at corresponding reference memory cells to establish a calibrator scale customized for each whole EEPROM device. The readback mechanism compares the multi-state data returned from analog sensing each memory cell to the reference memory cell calibration values to find a match. The matching reference cell directly identifies the original programming algorithm used and indirectly pinpoints the original analog value that appeared at the input at the instant of sampling. The readback signal is synthesized from such extracted or interpolated information using signal generators.

7 Claims, 6 Drawing Sheets

SYSTEM FOR RECORDING VOICE AS ANALOG VALUES PROGRAMMED INTO SINGLE BIT CELLS EEPROMS OR FLASH EEPROM

BACKGROUND OF THE INVENTION

1. Field of the Invention

The present invention relates to voice recording systems and more particularly to the representation of analog voice signals as a series of analog states that result in each single bit cell of an electrically erasable and programmable read only memory (EEPROM) or Flash EEPROM from the application of a library of ordered programming algorithms.

2. Description of the Prior Art

Integrated circuits have been used in conventional equipment to record and playback analog signals. For example, see U.S. Pat. No. 5,241,494, issued Aug. 31, 1993, to Trevor Blythe, et al. Such circuits use a sample and hold technique to capture instantaneous voltage values of samples in the incoming analog signal and hold them steady for analog-to-digital conversion. The resultant parallel digital word is essentially written into a sequential address location in an EEPROM. The sampling rate is high enough to satisfy the Nyquist criterion. The playback comprises sequentially reading back the EEPROM memory addresses at the sampling rate to a digital-to-analog converter. Such schemes do not make very efficient use of each cell of memory and therefore the systems built have very limited recording capacities.

A four-state EEPROM using floating-gate memory cells was described by Christoph Bleiker, et al., in an article by the same name in *IEEE J. Solid-State Circuits*, vol. SC-22, no. 3, June 1987, pp. 357–360. Such EEPROMs have individual cells that are bit programmable to any one of four analog ranges. Thus two bits of digital information can be stored in each analog programmed cell by defining the analog ranges as states 00, 01, 10, and 11. Retention time was reported to be more than twenty-two years at 125° C.

Yasuo Suzuki, et al., describe the use of read only memories (ROMs) to store one of three states in each cell, in U.S. Pat. No. 4,809,224, issued Feb. 28, 1989. Since ROMs generally vary in their programming and readback characteristics from device to device, but are uniform within from cell to cell, a reference cell within the ROM is used to derive a reference voltage. Voltage comparators are used to generate the logical output of a comparison made between the reference voltage and each cell's voltage, in order to recover the sense of the original information.

In U.S. Pat. No. 5,119,092, issued Jun. 2, 1992, Kazuyuki Sumi, et al., describe a system for encoding and decoding analog waveforms into digital coded words stored in a memory. Analog-to-digital and digital-to analog converters are used to pack and unpack groups of predetermined-length words into a digital memory.

A number of threshold levels is established for use with an EEPROM by Sanjay Mehrota, et al., in U.S. Pat. No. 5,163,021, issued Nov. 10, 1992. Such threshold levels are used for multi-state reading and writing of bit cells in the EEPROM. A set of reference cells provides for close tracking and adjustment of variations that commonly occur in the memory cells. One-to-many current mirrors are used to set several threshold levels simultaneously.

The subject of storing multi-state data in EEPROMs was further explored by Kenji Noguchi, et al., in U.S. Pat. No. 5,262,984, issued Nov. 16, 1993. Here, input binary data is converted to multi-state data. The threshold voltages of the individual cell transistors are set to a corresponding source region potential. During read, the drain current generated in the memory cell transistor is detected and recognized as multi-state data, e.g., a voltage assuming one of many predefined range slots. Such multi-state information is reconverted back to ordinary binary digital words that simulate the originals. Eight such range slots can be used to encode three binary bits, sixteen range slots to encode four binary bits, etc.

Eliyahou Harari uses incremental programming and erasing to do multi-state recording in EEPROMs, in U.S. Pat. No. 5,293,560, issued Mar. 8, 1994. In order to program each memory cell with a multi-state value, a series of voltage pulses is applied to the addressed cell interleaved by a readback of the result. The voltage pulses are of increasing amplitude with each one applied, e.g., to start at the low end and build toward the high end of the cell's range. The series of voltage pulses is stopped when the readback indicates the desired value has been accepted in the storage. An intelligent erase algorithm is used to prolong the limited useful life of the memory cells. Thus, significant processor time can be associated with the storage of each individual multi-state data, due to the closed-loop readback verification and erasing steps.

SUMMARY OF THE PRESENT INVENTION

It is therefore an object of the present invention to provide a method and a system for voice recording on EEPROMs or Flash EEPROMs.

It is another object of the present invention to provide a method and a system for storing analog signals that is storage efficient.

Another objective of the present invention is to provide a method and a system for storing analog signals that is quick and involves little processor overhead.

Briefly, a system embodiment of the present invention samples an incoming audio signal at a Nyquist criterion rate. The particular analog value sampled at each period causes one of a suite of programming algorithms to be selected and applied to a particular EEPROM or Flash EEPROM memory cell. For example, there can be 256 different programming algorithms in the suite that open-loop result in a zero to full range analog multi-state data being recorded in each memory cell. The programming algorithms can vary the programming pulse heights, pulse widths and number of pulses applied to the selected memory cell. For a corrected readback, each or a representative spread of programming algorithms are "test-fired" at corresponding reference memory cells to establish a calibrator scale customized for each whole EEPROM or Flash EEPROM device. The readback mechanism compares the multi-state data returned from analog sensing each memory cell to the reference memory cell calibration values to find a match. The matching reference cell directly identifies the original programming algorithm used and indirectly pinpoints the original analog value that appeared at the input at the instant of sampling. The readback signal is synthesized from such extracted or interpolated information using signal generators.

An advantage of the present invention is that a voice storage method and system are provided.

A further advantage of the present invention is that a method and system are provided that store increased amounts of information in a particular EEPROM or Flash EEPROM device.

Another advantage of the present invention is that a method and system are provided that demand little processor overhead to store information in an EEPROM or Flash EEPROM device.

These and other objects and advantages of the present invention will no doubt become obvious to those of ordinary skill in the art after having read the following detailed description of the preferred embodiment which is illustrated in the drawing figure.

DETAILED DESCRIPTION OF THE PREFERRED EMBODIMENT

Figure 1:
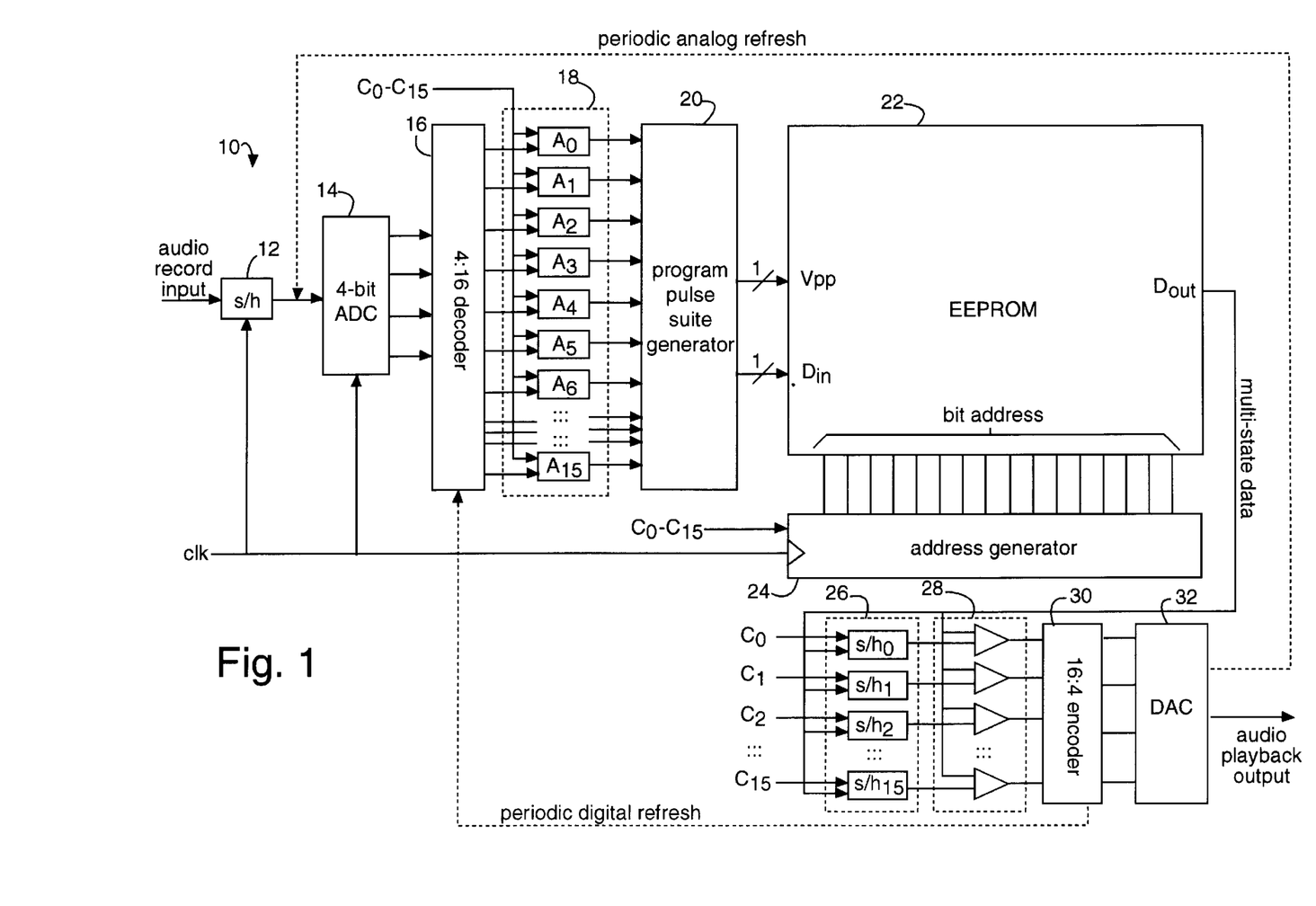
FIG. 1 is a functional block diagram of a first voice recording and playback system embodiment of the present invention based on an EEPROM.

FIG. 1 illustrates a first voice recording and playback system embodiment of the present invention, referred to herein by the general reference numeral 10. The system 10 comprises a sample-and-hold 12 that receives a voice recording input signal and is triggered to periodically sample by a system clock (CLK). The sampling rate preferably is high enough to satisfy the Nyquist criterion. An analog-to-digital converter (ADC) 14 converts the sampled audio signal into a four-bit digital word. A sixteen-bit binary ADC could be used followed by a conventional sixteen or thirty-two kilohertz adaptive delta pulse code modulator (ADPCM) that inputs sixteen parallel input bits and outputs four parallel output bits. A four-to-one-of-sixteen decoder 16 is connected to enable one of sixteen different programming algorithms ($A_0$–$A_{15}$) stored in a database 18. The selected algorithm ($A_0$–$A_{15}$) is used to control a program pulse suite generator 20.

The effect on the stored multi-state data value stored in an EEPROM caused by varying the characteristics of the applied program pulses is described by Eliyahou Harari in U.S. Pat. No. 5,293,560. Such patent is incorporated herein by reference. The multi-state data values stored in EEPROM are conventionally dependent on the programmed threshold voltages imparted by the respective floating gate transistor in each memory cell.

Programming pulses are typically applied for 100 microseconds ranging to one millisecond duration. The pulse width, voltage peak, and number of pulse repetitions can be varied to create unique combinations by the selected algorithms ($A_0$–$A_{15}$). In the present invention, a verifying readback is not considered necessary. The assumption here is that an open-loop system is possible because the same algorithm will produce the same result in all the memory cells within a given EEPROM device. It is also not critical that absolute multi-state data values be obtained, only that they be repeatable.

An EEPROM 22 is connected to be bit addressed by an address generator 24 and to be programmed by signals received from the program pulse suite generator 20.

The initial calibration of the system 10 involves writing a cadre of reference memory cells each with a corresponding algorithm ($A_0$–$A_{15}$) loaded into the program pulse suite generator 20. A group of inputs ($C_0$–$C_{15}$) selects which algorithm to use at database 18, and which memory cell to write at address generator 24. Before general storage readback can proceed, each of all the reference memory cells are selected by the address generator 24 to allow the loading of a corresponding analog reference channel in a sample-and-hold unit 26. A multiple comparator 28 represents a device that can identify which analog reference channel in the sample-and-hold unit 26 is producing an analog signal that best matches the data output ($D_{out}$) of the EEPROM 22 at any one time.

Such self-calibration can be implemented with preset values that are stored in permanent memory and loaded into the appropriate calibration registers at power-up. In one embodiment of the present invention, sixteen reference cells are used to store sixteen analog reference values. However, the present invention is not constrained to such a limited number. Given present semiconductor technology, 256 reference cells and corresponding reference levels should be practical. As the semiconductor art progresses, the use of even more reference levels will be reasonable.

An acceptable way to control the calibration inputs ($C_0$–$C_{15}$) and the timing of recording and playback is to include a microcomputer for the purpose in the system 10. The details of how to do this should be routine for the artisan.

A 16:4 encoder 30 receives an indication of which algorithm ($A_0$–$A_{15}$) originally programmed the particular memory cell in EEPROM 22. A digital-to-analog converter (DAC) 32 performs the inverse function of the ADC 14 and produces an audio playback signal. A sixteen-bit binary DAC could be used here instead, preceded by a conventional sixteen or thirty-two kilohertz adaptive delta pulse code demodulator (ADPCM) that inputs four parallel input bits and outputs sixteen parallel output bits.

The exact multi-state data values that are used between the EEPROM 22 and the combination of the sample-and-hold unit 26 and multiple comparator 28 need not be linear nor proportionally ordered. However, the particular suite of algorithms ($A_0$–$A_{15}$) used could be adjusted to produce linear transfer characteristics if that was important in a particular application. The only requirement is that the multi-state data values observed must be useable to allow backtracking to the particular algorithms ($A_0$–$A_{15}$) that produced them. Once the particular algorithms ($A_0$–$A_{15}$) are identified, the original audio record input that would have caused the ADC 14 to select it can be assumed.

It may happen that some or all of the multi-state data values stored in the EEPROM 22 will degrade over time. In order to counteract such analog degradation, two different methods of refresh maybe used. Such refreshing loosely parallels the refresh cycles that are necessary in dynamic random access memories (DRAMs). A first method involves returning the digital four-bit binary output of the 16:4 encoder 30 to the input of the 4:16 decoder 16 and running the program pulse suite generator 20 to rewrite the memory cell in the EEPROM 22 addressed by the address generator 24. Such a digital refresh circuit could be readily implemented by a microcomputer and a few strategically placed data selectors. A second method involves returning the analog output of the DAC 32 to the analog input of the ADC 14 and running the program pulse suite generator 20 to rewrite the memory cell in the EEPROM 22 addressed by the address generator 24. An analog multiplexer controlled by a microcomputer could serve such a purpose.

Figure 2:
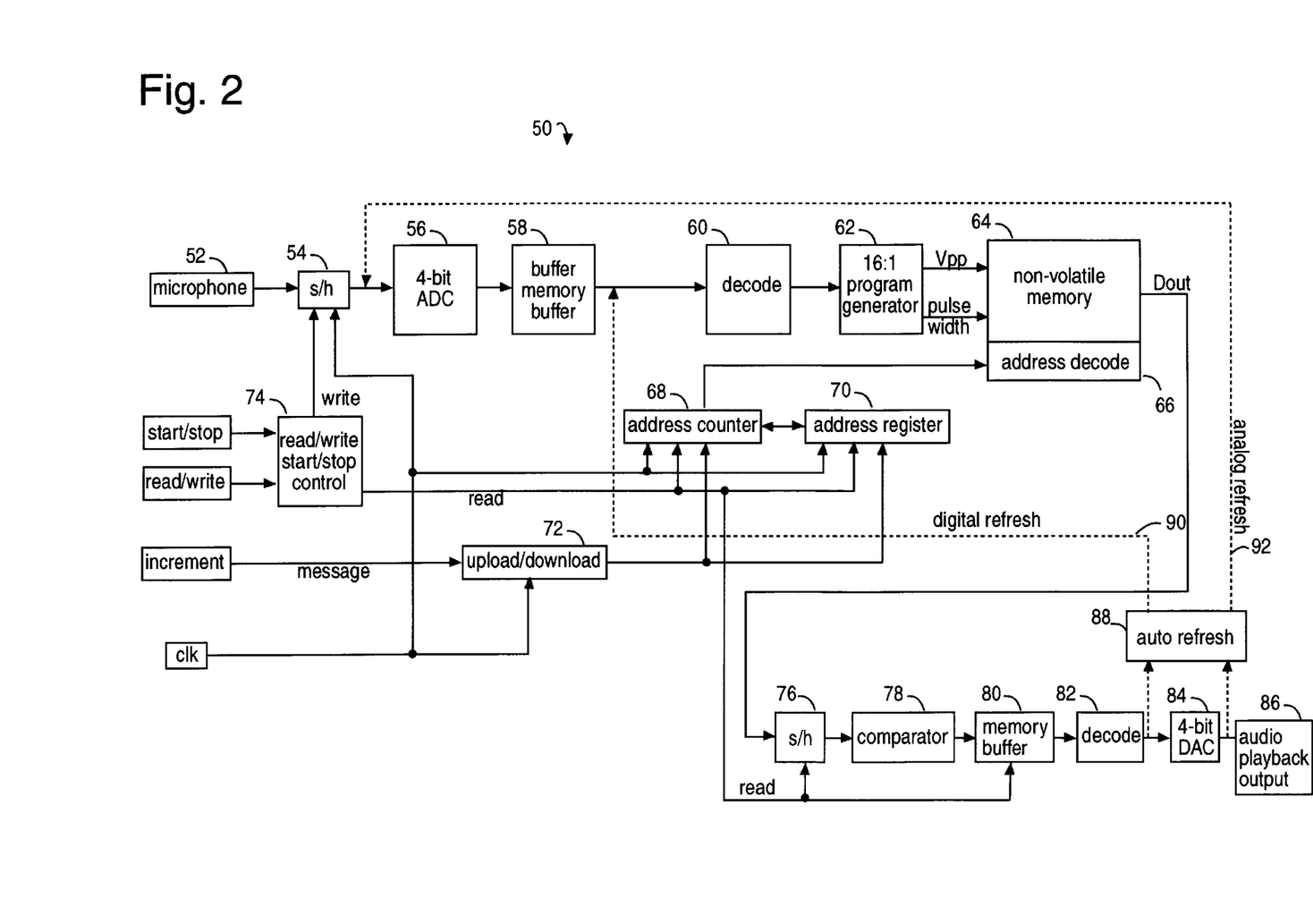
FIG. 2 is a functional block diagram of a second voice recording and playback system embodiment of the present invention based on an EEPROM.

FIG. 2 illustrates a second voice recording and playback system embodiment of the present invention, and is referred to herein by the general reference numeral 50. The system 50 is similar in construction and purpose with the system 10. System 50 comprises a microphone input 52 that provides continuous analog signals in real-time to a sample-and-hold (S/H) device 54. A stream of analog samples that preferably satisfy the Nyquist criterion are fed to an analog-to-digital converter (ADC) 56. In one case, four-bit binary encoded digital words are forwarded at the sample rate to a buffer memory 58 to prevent data overrunning of the downstream memory writing mechanisms. Such downstream processes are assumed to be incapable of operating at the real-time input data rates. A four-bit binary to one-of-sixteen decoder 60 selects a particular program within a program generator 62 to write a single bit in a non-volatile memory 64 for each analog input sample. An address decoder 66 controls which bits are addressed for reading and writing within the non-volatile memory 64. An address counter 68 allows sequential addressing of the address decoder 66 timed by a clock input. An address register 70 can be used to load starting addresses in by parallel transfer to the address counter 68. An upload/download controller 72 directs such sequential addressing and starting address preloads. A read/write start/stop controller 74 provides the record and playback timing and memory segment selection necessary to implement a voice recording system. A digital data output (Dout) from the non-volatile memory 64 provides single-bit data that includes analog information encoded as voltage levels. Such encodings need not be directly proportional to the corresponding original analog input samples. A sample-and-hold (S/H) device 76 samples each encoding and holds it while the non-volatile memory 64 is free to be sent to another address. A comparator 78 provides a one-of-sixteen digital output according to an embedded transfer function that mimics the non-linearity of doing analog recording on each bit of a digital memory such as the non-volatile memory 64. The transfer function itself can be encoded in special reference bits stored in the non-volatile memory 64 that produce empirical evidence, or it can be modeled according to lot averages of individual production pieces used for the non-volatile memory 64. A buffer memory 80 allows for restoration of the original sample timing and thus recovers the real-time quality of the recorded voice. A decoder 82 provides for one-of-sixteen to four-bit binary encoding necessary to drive a digital to analog converter (DAC) 84. An audio playback output 86 is provided by the DAC 84. An auto-refresh controller 88 preferably provides either a digital refresh value 90 or an analog refresh quantity 92 for periodic updating at their respective inputs to combat drift that occurs in the stored analog values in each bit of the non-volatile memory 64. Both EEPROM and Flash EEPROM memory storage types can benefit from auto-refresh mechanisms that channel back drift information by either digital or analog means. The resolution of such drift correction schemes should be fine enough and sufficiently stable to control accumulated long-term drift errors.

Figure 3:
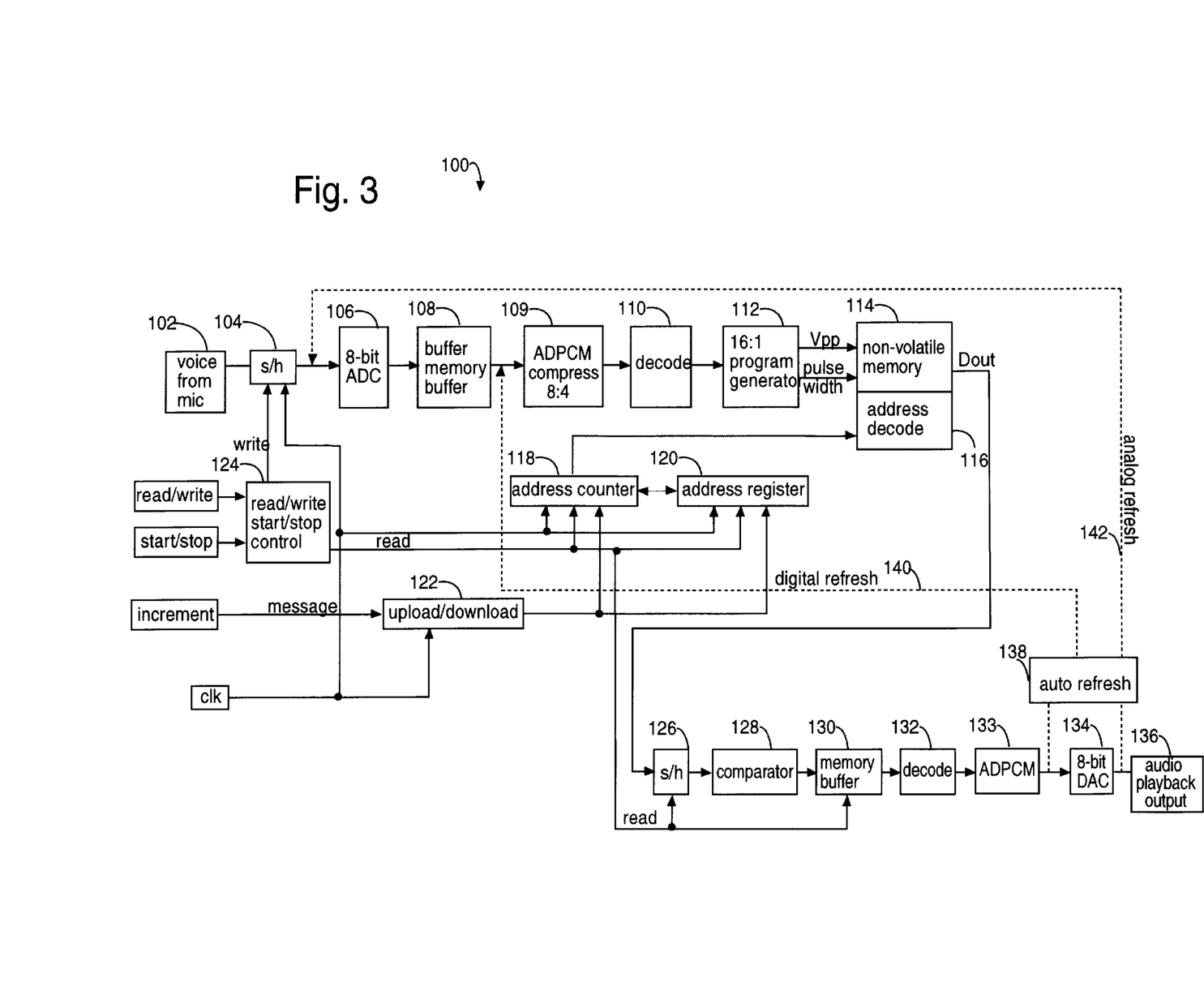
FIG. 3 is a functional block diagram of a third voice recording and playback system embodiment of the present invention based on an EEPROM.

FIG. 3 illustrates a third voice recording and playback system embodiment of the present invention, and is referred to herein by the general reference numeral 100. The system 100 is similar in construction and purpose with the system 10. System 100 comprises a microphone input 102 that provides continuous analog signals in real-time to a sample-and-hold (s/h) device 104. A stream of analog samples that preferably satisfy the Nyquist criterion are fed to an analog-to-digital converter (ADC) 106. In one case, eight-bit binary encoded digital words are forwarded at the sample rate to a buffer memory 108 to prevent data overrunning of the downstream memory writing mechanisms. Such downstream processes are assumed to be incapable of operating at the real-time input data rates. An adaptive delta pulse code modulator (ADPCM) 109 does an eight-bit to four-bit data compression. A four-bit binary to one-of-sixteen decoder 110 selects a particular program within a program generator 112 to write a single bit in a non-volatile memory 114 for each analog input sample. An address decoder 116 controls which bits are addressed for reading and writing within the non-volatile memory 114. An address counter 118 allows sequential addressing of the address decoder 116 timed by a clock input. An address register 120 can be used to load starting addresses in by parallel transfer to the address counter 118. An upload/download controller 122 directs such sequential addressing and starting address preloads. A read/write start/stop controller 124 provides the record and playback timing and memory segment selection necessary to implement a voice recording system. A digital data output (Dout) from the non-volatile memory 114 provides single-bit data that includes analog information encoded as voltage levels. Such encodings need not be directly proportional to the corresponding original analog input samples. A sample-and-hold (s/h) device 126 samples each encoding and holds it while the non-volatile memory 114 is free to be sent to another address. A comparator 128 provides a one-of-sixteen digital output according to an embedded transfer function that mimics the non-linearity of doing analog recording on each bit of a digital memory such as the non-volatile memory 114. The transfer function itself can be encoded in special reference bits stored in the non-volatile memory 114 that produce empirical evidence, or it can be modeled according to lot averages of individual production pieces used for the non-volatile memory 114. A buffer memory 130 allows for restoration of the original sample timing and thus recovers the real-time quality of the recorded voice. A decoder 132 provides for one-of-sixteen to four-bit binary encoding and an ADPCM demodulator 133 restores the eight-bit binary digital word necessary to drive a digital to analog converter (DAC) 134. An audio playback output 136 is provided by the DAC 134. An auto-refresh controller 138 preferably provides either a digital refresh value 140 or an analog refresh quantity 142 for periodic updating at their respective inputs to combat drift that occurs in the stored analog values in each bit of the non-volatile memory 114.

Figure 4:
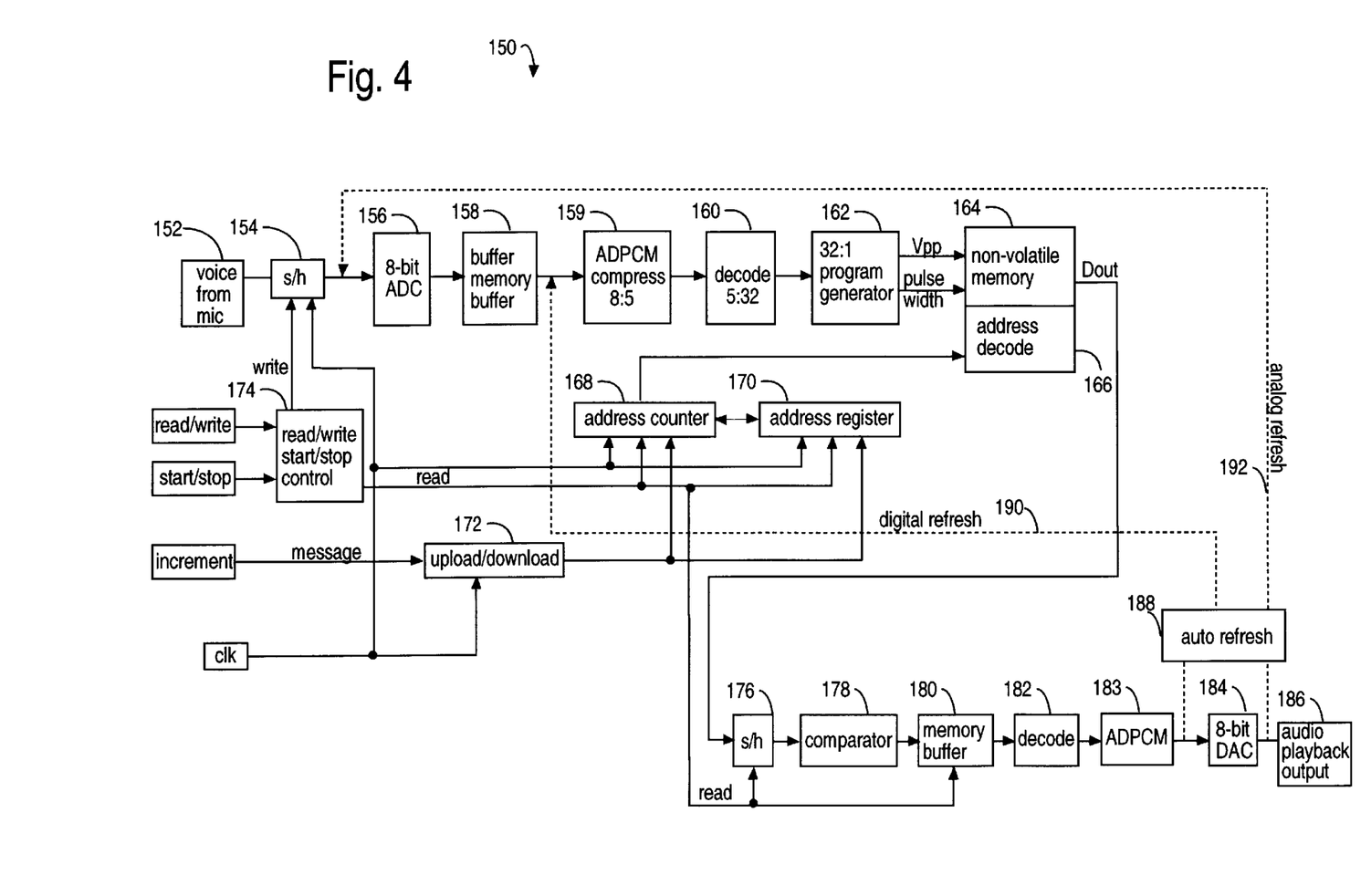
FIG. 4 is a functional block diagram of a fourth voice recording and playback system embodiment of the present invention based on an EEPROM.

FIG. 4 illustrates a fourth voice recording and playback system embodiment of the present invention, and is referred to herein by the general reference numeral 150. The system 150 is very similar in construction and purpose with the system 100, but further includes error correction. System 150 comprises a microphone input 152 that provides continuous analog signals in real-time to a sample-and-hold (s/h) device 154. A stream of analog samples that preferably satisfy the Nyquist criterion are fed to an analog-to-digital converter (ADC) 156. In one case, eight-bit binary encoded digital words are forwarded at the sample rate to a buffer memory 158 to prevent data overrunning of the downstream memory writing mechanisms. Such downstream processes are assumed to be incapable of operating at the real-time input data rates. An adaptive delta pulse code modulator (ADPCM) 159 does an eight-bit to five-bit data compression. A five-bit binary to one-of-thirty-two decoder 160 selects a particular program within a program generator 162 to write a single bit in a non-volatile memory 164 for each analog input sample. An address decoder 166 controls which bits are addressed for reading and writing within the non-volatile memory 164. An address counter 168 allows sequential addressing of the address decoder 166 timed by a clock input. An address register 170 can be used to load starting addresses in by parallel transfer to the address counter 168. An upload/download controller 172 directs such sequential addressing and starting address preloads. A read/write start/stop controller 174 provides the record and playback timing and memory segment selection necessary to implement a voice recording system. A digital data output (Dout) from the non-volatile memory 164 provides single-bit data that includes analog information encoded as voltage levels. Such encodings need not be directly proportional to the corresponding original analog input samples. A sample-and-hold (s/h) device 176 samples each encoding and holds it while the non-volatile memory 164 is free to be sent to another address. A comparator 178 provides a one-of-thirty-two digital output according to an embedded transfer function that mimics the non-linearity of doing analog recording on each bit of a digital memory such as the non-volatile memory 164. The transfer function itself can be encoded in special reference bits stored in the non-volatile memory 164 that produce empirical evidence, or it can be modeled according to lot averages of individual production pieces used for the non-volatile memory 164. A buffer memory 180 allows for restoration of the original sample timing and thus recovers the real-time quality of the recorded voice. A decoder 182 provides for one-of-thirty-two to five-bit binary encoding and an ADPCM demodulator 183 restores the eight-bit binary digital word necessary to drive a digital to analog converter (DAC) 184. An audio playback output 186 is provided by the DAC 184. An auto-refresh controller 188 preferably provides either a digital refresh value 190 or an analog refresh quantity 192 for periodic updating at their respective inputs to combat drift that occurs in the stored analog values in each bit of the non-volatile memory 164.

Figure 5:
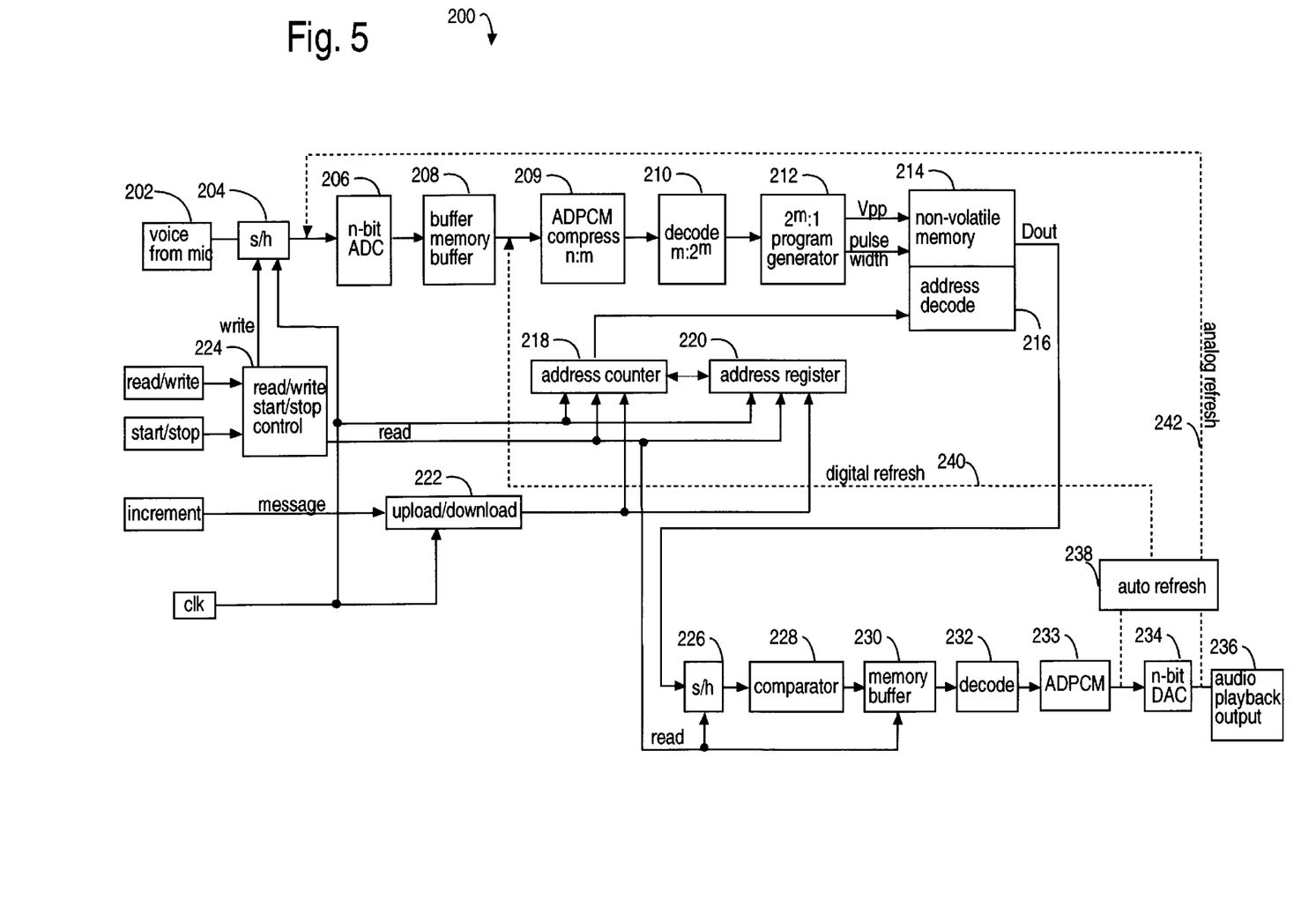
FIG. 5 is a functional block diagram of a fifth voice recording and playback system embodiment of the present invention based on an EEPROM.

FIG. 5 illustrates a fifth voice recording and playback system embodiment of the present invention, and is referred to herein by the general reference numeral 200. The system 200 is similar in construction and purpose with the system 150. System 200 comprises a microphone input 202 that provides continuous analog signals in real-time to a sample-and-hold (s/h) device 204. A stream of analog samples that preferably satisfy the Nyquist criterion are fed to an analog-to-digital converter (ADC) 206. Binary encoded digital words n-bits wide are forwarded at the sample rate to a n-bit buffer memory 208 to prevent data overrunning of the downstream memory writing mechanisms. Such downstream processes are assumed to be incapable of operating at the real-time input data rates. An adaptive delta pulse code modulator (ADPCM) 209 does an n-bit to m-bit data compression. A m-bit binary to one-of-$2^m$ decoder 210 selects a particular program within a program generator 212 to write a single bit in a non-volatile memory 214 for each analog input sample. For example, memory 214 can comprise a EEPROM or Flash EEPROM integrated circuit. An address decoder 216 controls which bits are addressed for reading and writing within the non-volatile memory 214. An address counter 218 allows sequential addressing of the address decoder 216 timed by a clock input. An address register 220 can be used to load starting addresses in by parallel transfer to the address counter 218. An upload/download controller 222 directs such sequential addressing and starting address preloads. A read/write start/stop controller 224 provides the record and playback timing and memory segment selection necessary to implement a voice recording system. A digital data output (Dout) from the non-volatile memory 214 provides single-bit data that includes analog information encoded as voltage levels. Such encodings need not be directly proportional to the corresponding original analog input samples. A sample-and-hold (s/h) device 226 samples each encoding and holds it while the non-volatile memory 214 is free to be sent to another address. A comparator 228 provides a one-of-$2^m$ digital output according to an embedded transfer function that mimics the non-linearity of doing analog recording on each bit of a digital memory such as the non-volatile memory 214. The transfer function itself can be encoded in special reference bits stored in the non-volatile memory 214 that produce empirical evidence, or it can be modeled according to lot averages of individual production pieces used for the non-volatile memory 214. A buffer memory 230 allows for restoration of the original sample timing and thus recovers the real-time quality of the recorded voice. A decoder 232 provides for one-of-$2^m$ to m-bit binary encoding and an ADPCM demodulator 233 restores the n-bit binary digital word necessary to drive a digital to analog converter (DAC) 234. An audio playback output 236 is provided by the DAC 234. An auto-refresh controller 238 preferably provides either a digital refresh value 240 or an analog refresh quantity 242 for periodic updating at their respective inputs to combat drift that occurs in the stored analog values in each bit of the non-volatile memory 214.

Figure 6:
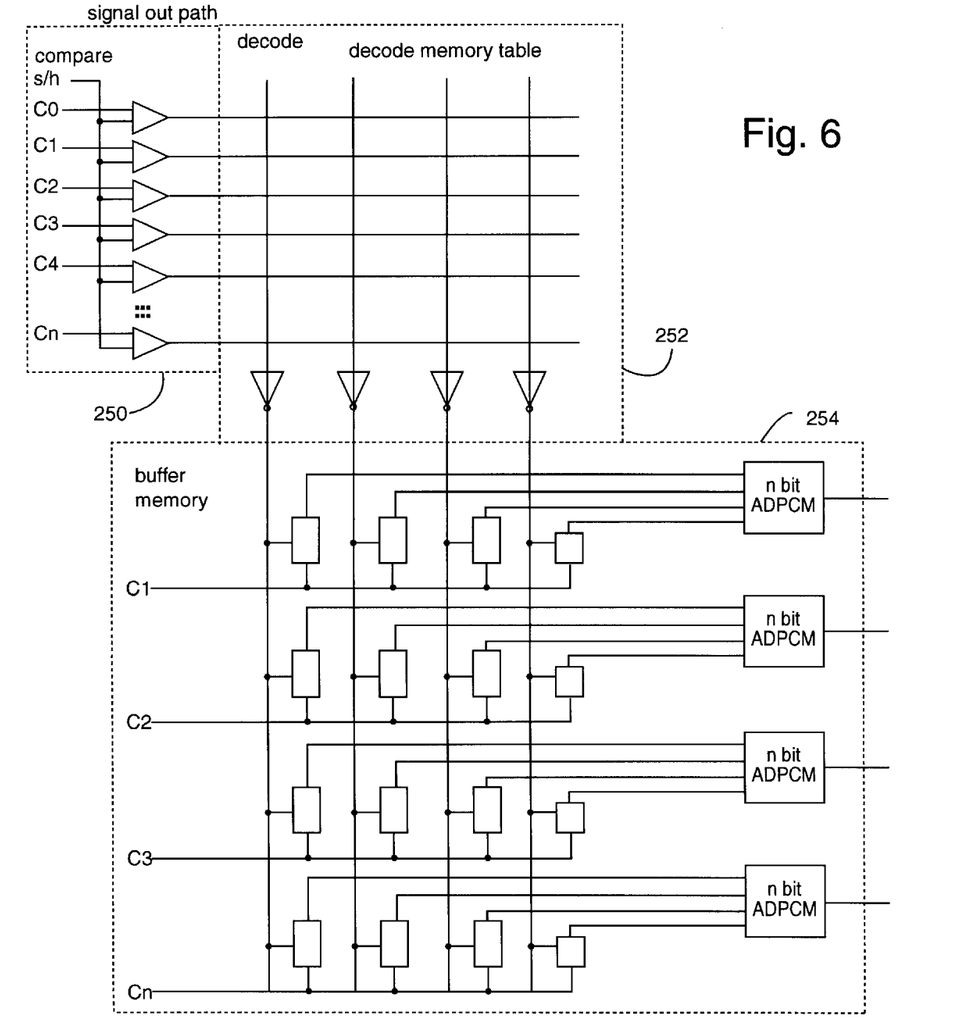
FIG. 6 is a schematic diagram that represents further details regarding the implementation of the comparator, buffer, and decoder functions in the output stages of the systems diagrammed in FIGS. 1–5

FIG. 6 represents further detail regarding the implementation of the comparator 178, buffer 180, and decoder 182 function in FIG. 4 and also the similar blocks diagrammed in FIGS. 1–3 and 5. A comparator 250 receives a sample-and-hold value provided by reading the non-volatile memory and uses a bank of two-input analog comparators to find a closest reference voltage C0 . . . Cn. A decoder 252 receives the results of the comparisons and provides an output selection that drives a buffer memory 254. Table I summarizes the functions of the devices in FIG. 6.

TABLE I

| R/W switch | start pulse | stop | mode | upload |
|---|---|---|---|---|
| read = high | start address | stop address | address register to address counter | advance address counter |
| write = low | start address | stop address | address counter to address register | n/a |

Herein, "EEPROM" is an acronym used for electrically erasable programmable read-only memory. Pronounced "double-ee-prom", an EEPROM is a special type of programmable read-only memory (PROM) that can be erased by exposing it to an electrical charge. Like other types of PROM, EEPROM retains its contents even when the power is turned off. Also like other types of read-only memory (ROM), EEPROM is not generally as fast as RAM. EEPROM is similar to flash memory (sometimes called Flash EEPROM). The principal difference is that EEPROM requires data to be written or erased one byte at a time whereas flash memory allows data to be written or erased in blocks. This generally makes flash memory faster.

Although the present invention has been described in terms of the presently preferred embodiment, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. An analog signal recording system, comprising:

at least one of an electrically erasable and programmable read only memory (EEPROM) and Flash EEPROM having a plurality of memory cells each with a floating gate capable of being programmed to store multi-state data as an analog value in a single data bit, wherein data to be written or erased to said memory cells is at least possible one byte at a time for said EEPROM, and at most allows data to be written or erased in blocks in a flash-memory style operation for said Flash EEPROM;

a one-of-n programming pulse selector for selecting one of a plurality of different programming-pulse generators in response to a sampled analog input voltage and connected to program a multi-state data as an analog value in a single data bit of said EEPROM; and a multi-state analog data to analog output decoder for recognizing which of said plurality of different programming-pulse generators has generated a particular multi-state data as an analog value in said single data bit of said EEPROM, and for synthesizing an analog approximation at an analog output that estimates said sampled input voltage.

2. The system of claim 1, further comprising:

a reference writer that uses a predetermined one of said plurality of different programming-pulse generators to write a reference memory cell reserved in said EEPROM.

3. The system of claim 2, further comprising:

a reference reader for comparing an analog reference value obtained from a readback of said memory reference cell reserved in said EEPROM and for deriving a parallel digital binary word by comparing particular individual multi-state data read from said reserved EEPROM/Flash-EEPROM memory cell to a remainder of EEPROM/Flash-EEPROM memory cells.

4. The system of claim 3, wherein:

the one-of-n programming pulse selector comprises computer-programmable pulse generator hardware and selectable computer-program algorithms that are associated with particular analog input values, wherein each algorithm produces a different combination of pulse durations, pulse repetitions, and pulse amplitudes that are applied to the EEPROM to represent each of said corresponding analog input values.

5. The system of claim 1, wherein:

an auto-refresh mechanism connected to said EEPROM/Flash-EEPROM memory cells to periodically correct drift in the analog value stored in each memory cell that includes at least one of an analog and digital signal feedback, wherein said drift is corrected by returning a drifted stored analog value to a nominal target value produced by a particular selected one of said programming-pulse generators.

6. The system of claim 1, further comprising:

a self-calibrator connected to preset each said EEPROM/Flash-EEPROM memory cells to a single one of a finite number of discrete reference values on power-up according to a corresponding one of said programming-pulse generators.

7. A method for recording analog audio signals, the method comprising the steps of:

defining a suite of different programming algorithms that each produce a unique multi-state data value when used to program a plurality of memory cells each with a floating gate in at least one of an electrically erasable and programmable read only memory (EEPROM) and Flash EEPROM having a plurality of memory cells each with a floating gate capable of being programmed to store multi-state data, wherein data to be written or erased to said memory cells is at least possible one byte at a time for said EEPROM, and at most allows data to be written or erased in blocks in a flash-memory style operation for said Flash EEPROM;

selecting one of said programming algorithms to represent a particular instantaneous value of an analog audio input signal at a sampling rate;

programming a sequential series of a first set of said plurality of memory cells with said corresponding algorithms according to a sample obtained of said analog audio input sample;

programming a second set of said plurality of memory cells each with a different one of said programming algorithms to represent a particular reference value;

reading a multi-state data value from a particular one of said first set of said plurality of memory cells;

comparing said multi-state data value read from particular ones of said first set of said plurality of memory cells to the whole of multi-state data values obtained in parallel from said second set of said plurality of memory cells; and deriving an analog audio output signal from said step of comparing that is a reconstruction of said analog audio input signal.

* * * * *